(12) United States Patent
Sakata et al.

(10) Patent No.: US 9,905,462 B2
(45) Date of Patent: Feb. 27, 2018

(54) SEMICONDUCTOR DEVICE AND METHOD FOR MANUFACTURING THE SAME

(71) Applicant: Toshiba Memory Corporation, Tokyo (JP)

(72) Inventors: Atsuko Sakata, Mie (JP); Takeshi Ishizaki, Aichi (JP); Shinya Okuda, Oita (JP); Kei Watanabe, Mie (JP); Masayuki Kitamura, Mie (JP); Satoshi Wakatsuki, Mie (JP); Daisuke Ikeno, Mie (JP); Junichi Wada, Mie (JP); Hirotaka Ogihara, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/985,969

(22) Filed: Dec. 31, 2015

(65) Prior Publication Data

US 2017/0053869 A1 Feb. 23, 2017

Related U.S. Application Data

(60) Provisional application No. 62/207,563, filed on Aug. 20, 2015.

(51) Int. Cl.
| | |
|---|---|
| *H01L 27/115* | (2017.01) |
| *H01L 29/792* | (2006.01) |
| *H01L 21/768* | (2006.01) |
| *H01L 27/11582* | (2017.01) |
| *H01L 21/3065* | (2006.01) |
| *H01L 29/788* | (2006.01) |

(52) U.S. Cl.
CPC .... *H01L 21/76879* (2013.01); *H01L 21/3065* (2013.01); *H01L 21/76843* (2013.01); *H01L 21/76864* (2013.01); *H01L 27/11582* (2013.01); *H01L 29/7881* (2013.01)

(58) Field of Classification Search
CPC .............. G11C 16/0483; G11C 17/123; G11C 2213/75; H01L 27/11524; H01L 27/11529; H01L 27/1157
See application file for complete search history.

(56) References Cited

U.S. PATENT DOCUMENTS

| | | |
|---|---|---|
| 7,936,004 B2 | 5/2011 | Kito et al. |
| 8,264,031 B2 | 9/2012 | Kidoh et al. |
| 8,373,222 B2 | 2/2013 | Sekine et al. |

(Continued)

*Primary Examiner* — Mary Wilczewski
*Assistant Examiner* — Tsz Chiu
(74) *Attorney, Agent, or Firm* — Finnegan, Henderson, Farabow, Garrett & Dunner, L.L.P.

(57) ABSTRACT

According to one embodiment, the stacked body includes a plurality of metal films, a plurality of silicon oxide films, and a plurality of intermediate films. The intermediate films are provided between the metal films and the silicon oxide films. The intermediate films contain silicon nitride. Nitrogen composition ratios of the intermediate films are higher on sides of interfaces between the intermediate films and the metal films than on sides of interfaces between the intermediate films and the silicon oxide films. Silicon composition ratios of the intermediate films are higher on sides of interfaces between the intermediate films and the silicon oxide films than on sides of interfaces between the intermediate films and the metal films.

6 Claims, 11 Drawing Sheets

(56) References Cited

U.S. PATENT DOCUMENTS

| | | | |
|---|---|---|---|
| 8,507,970 B2* | 8/2013 | Jeong | H01L 27/105 |
| | | | 257/316 |
| 8,551,838 B2 | 10/2013 | Kito et al. | |
| 8,922,018 B2 | 12/2014 | Ishizaki et al. | |
| 9,064,735 B2 | 6/2015 | Kito et al. | |
| 2007/0252201 A1 | 11/2007 | Kito et al. | |
| 2009/0121271 A1* | 5/2009 | Son | H01L 21/8221 |
| | | | 257/315 |
| 2009/0294828 A1* | 12/2009 | Ozawa | H01L 27/11568 |
| | | | 257/319 |
| 2010/0059811 A1 | 3/2010 | Sekine et al. | |
| 2010/0200906 A1 | 8/2010 | Kidoh et al. | |
| 2011/0147824 A1* | 6/2011 | Son | G11C 16/0483 |
| | | | 257/324 |
| 2011/0284947 A1 | 11/2011 | Kito et al. | |
| 2011/0287597 A1 | 11/2011 | Kito et al. | |
| 2012/0306081 A1 | 12/2012 | Ishizaki et al. | |
| 2014/0061770 A1* | 3/2014 | Lee | H01L 29/66825 |
| | | | 257/324 |
| 2015/0194440 A1* | 7/2015 | Noh | H01L 29/66833 |
| | | | 257/324 |
| 2016/0276204 A1 | 9/2016 | Sakata et al. | |

* cited by examiner

SEMICONDUCTOR DEVICE AND METHOD FOR MANUFACTURING THE SAME

CROSS-REFERENCE TO RELATED APPLICATION

This application is based upon and claims the benefit of priority from U.S. Provisional Patent Application 62/207,563, filed on Aug. 20, 2015; the entire contents of which are incorporated herein by reference.

FIELD

Embodiments described herein relate generally to a semiconductor device and a method for manufacturing the same.

BACKGROUND

A memory device having a three-dimensional structure has been proposed. The memory device includes a stacked body. The stacked body includes a plurality of electrode films stacked with insulating films interposed. A charge storage film and a semiconductor film are provided inside the stacked body to extend in a stacking direction of the stacked body.

In the case where metal films as the electrode films are stacked alternately with silicon oxide films as the insulating films in such a three-dimensional memory device, resistance of oxidized metal films may increase.

DETAILED DESCRIPTION

Figure 1:
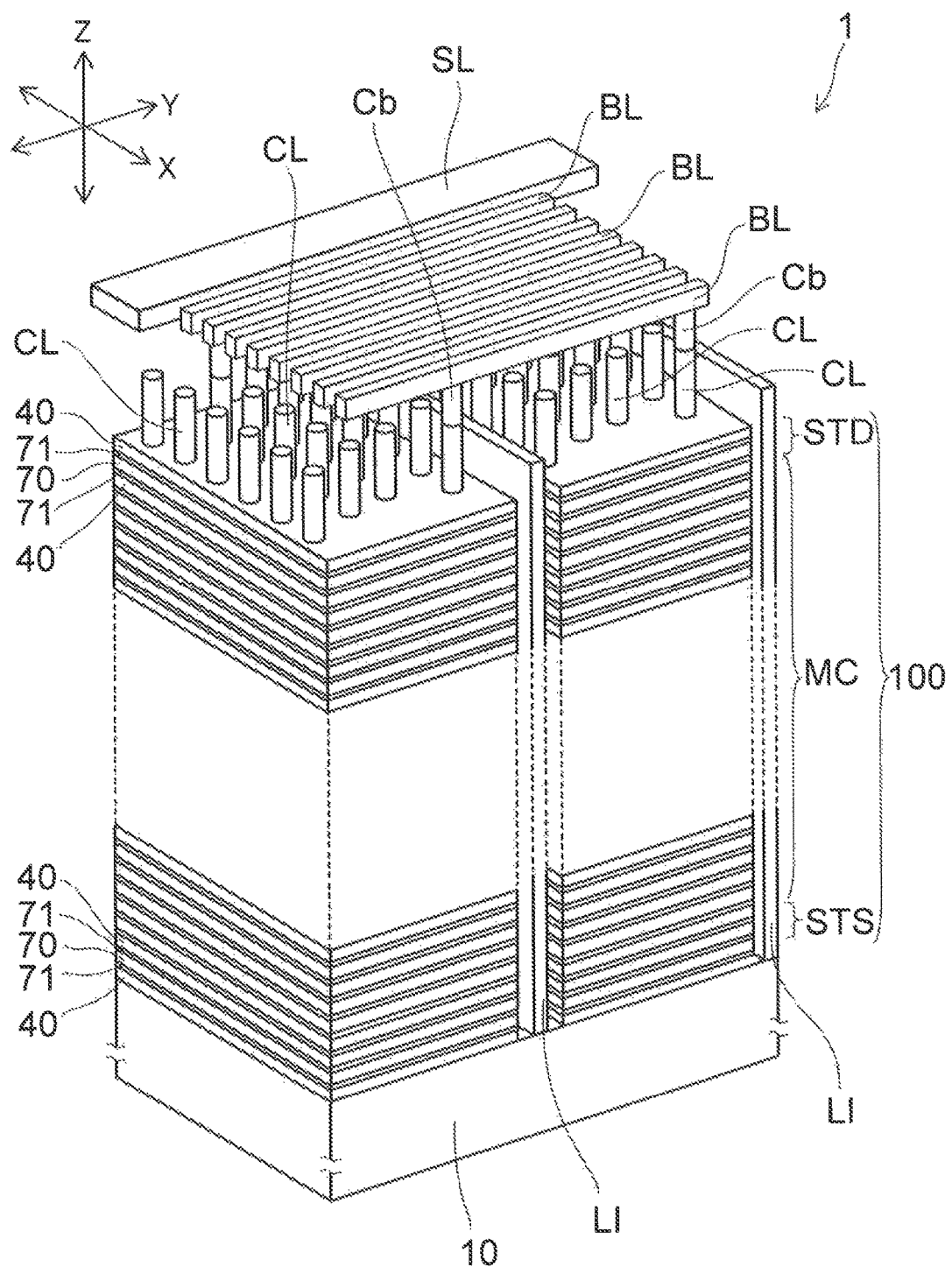
FIG. 1 is a schematic perspective view of a memory cell array of a semiconductor device of an embodiment.

According to one embodiment, a semiconductor device includes a stacked body, a semiconductor film, and a stacked film. The stacked body includes a plurality of metal films, a plurality of silicon oxide films, and a plurality of intermediate films. The metal films contain at least one of tungsten and molybdenum. The intermediate films are provided between the metal films and the silicon oxide films. The intermediate films contact the metal films and the silicon oxide films. The intermediate films contain silicon nitride. The semiconductor film extends in a stacking direction of the stacked body in the stacked body. The stacked film is provided between the semiconductor film and the metal films. The stacked film includes a charge storage film. Nitrogen composition ratios of the intermediate films are higher on sides of interfaces between the intermediate films and the metal films than on sides of interfaces between the intermediate films and the silicon oxide films. Silicon composition ratios of the intermediate films are higher on sides of interfaces between the intermediate films and the silicon oxide films than on sides of interfaces between the intermediate films and the metal films.

Embodiments will now be described with reference to the drawings. The same components in the drawings are marked with the same reference numerals.

A semiconductor device of an embodiment is semiconductor memory device including a memory cell array.

FIG. 1 is a schematic perspective view of the memory cell array 1 of the embodiment.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a stacked body 100 that is provided on the major surface of the substrate 10, a plurality of columnar units CL, a plurality of conductive members LI, and upper layer interconnects provided on the stacked body 100. Bit lines BL and a source layer SL are shown as the upper layer interconnects in FIG. 1.

The columnar units CL are formed in circular columnar or elliptical columnar configurations extending in the stacking direction (the Z-direction) through the stacked body 100. The conductive members LI extend in the X-direction and the stacking direction of the stacked body 100 (the Z-direction) between the substrate 10 and the upper layer interconnects, and divide the stacked body 100 in the Y-direction.

For example, the columnar units CL have a staggered arrangement. Or, the columnar units CL may have a square lattice arrangement along the X-direction and the Y-direction.

The bit lines (e.g., the metal films) BL are provided on the stacked body 100. The bit lines BL are separated from each other in the X-direction; and each of the bit lines BL extends in the Y-direction.

The upper end portions of the columnar units CL are connected to the bit lines BL via contacts Cb. The plurality of columnar units CL, each of which is selected from each of regions (blocks) separated in the Y-direction by the conductive members LI, are connected to one common bit line BL.

Figure 2:
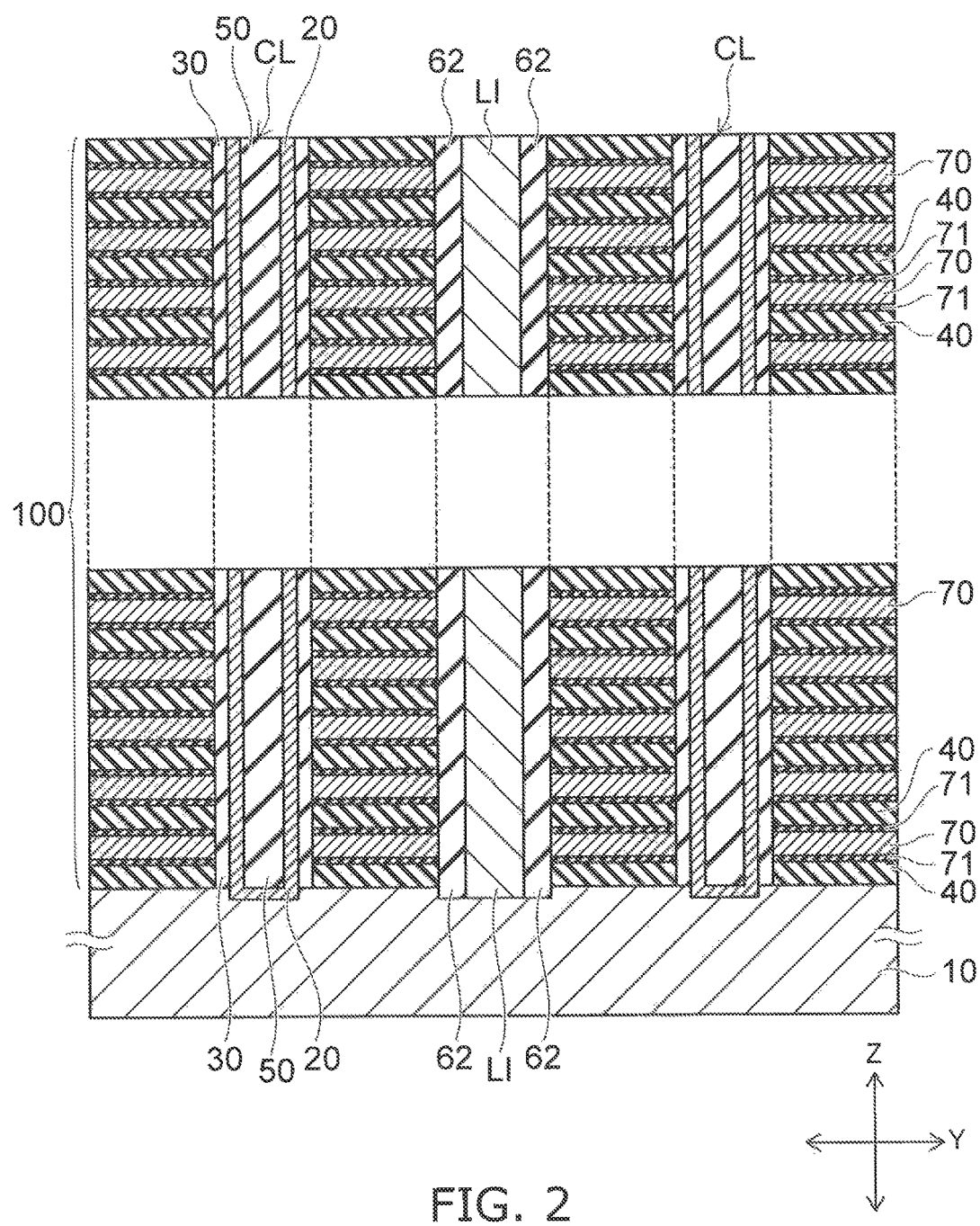
FIG. 2 is a schematic cross-sectional view of the memory cell array of the embodiment.

FIG. 2 is a schematic cross-sectional view of a portion where the substrate 10 and the stacked body 100 are provided. FIG. 2 shows a cross section parallel to the Y-Z plane of FIG. 1.

The stacked body 100 includes a plurality of metal films 70, a plurality of silicon oxide films 40, and a plurality of intermediate films 71. The metal films 70, the silicon oxide films 40, and the intermediate films 71 are stacked in a direction (the Z-direction) perpendicular to the major surface of the substrate 10.

The metal films 70 are stacked, with the silicon oxide films 40 and the intermediate films 71 interposed, in the Z-direction at a prescribed period. One layer of the silicon oxide films 40 and two layers of the intermediate films 71 are provided between the metal film 70 and the metal film 70 adjacent to each other in the stacking direction.

The intermediate films 71 are provided between the silicon oxide film 40 and the lower surface of the metal film 70 and between the silicon oxide film 40 and the upper surface of the metal film 70. The intermediate films 71 contact the metal films 70 and the silicon oxide films 40.

The metal films 70 are thicker than the intermediate films 71. The silicon oxide films 40 are thicker than the intermediate films 71.

The intermediate films 71 are separated from each other without being connected in the stacking direction of the stacked body 100.

The metal films 70 include at least one of tungsten (W) and molybdenum (Mo). The metal films 70 are tungsten films that include tungsten as a major component, or molybdenum films that include molybdenum as a major component. The silicon oxide films 40 include $SiO_2$ as a major component.

The intermediate films 71 include silicon nitride as a major component. The intermediate films 71 are silicon nitride films or silicon oxynitride films.

The columnar unit CL includes a memory film 30, a semiconductor film 20, and a core insulating film 50. The memory film 30 and the semiconductor film 20 extend in pipe-like configurations in the stacking direction (the Z-direction) through the stacked body 100. The memory film 30 is provided between the stacked body 100 and the semiconductor film 20, and is provided around the semiconductor film 20 from the outer circumferential side. The core insulating film 50 is provided on the inner side of the semiconductor film 20 having the pipe-like configuration. The upper end portion of the semiconductor film 20 is electrically connected to the bit line BL via the contact Cb shown in FIG. 1.

Figure 3:
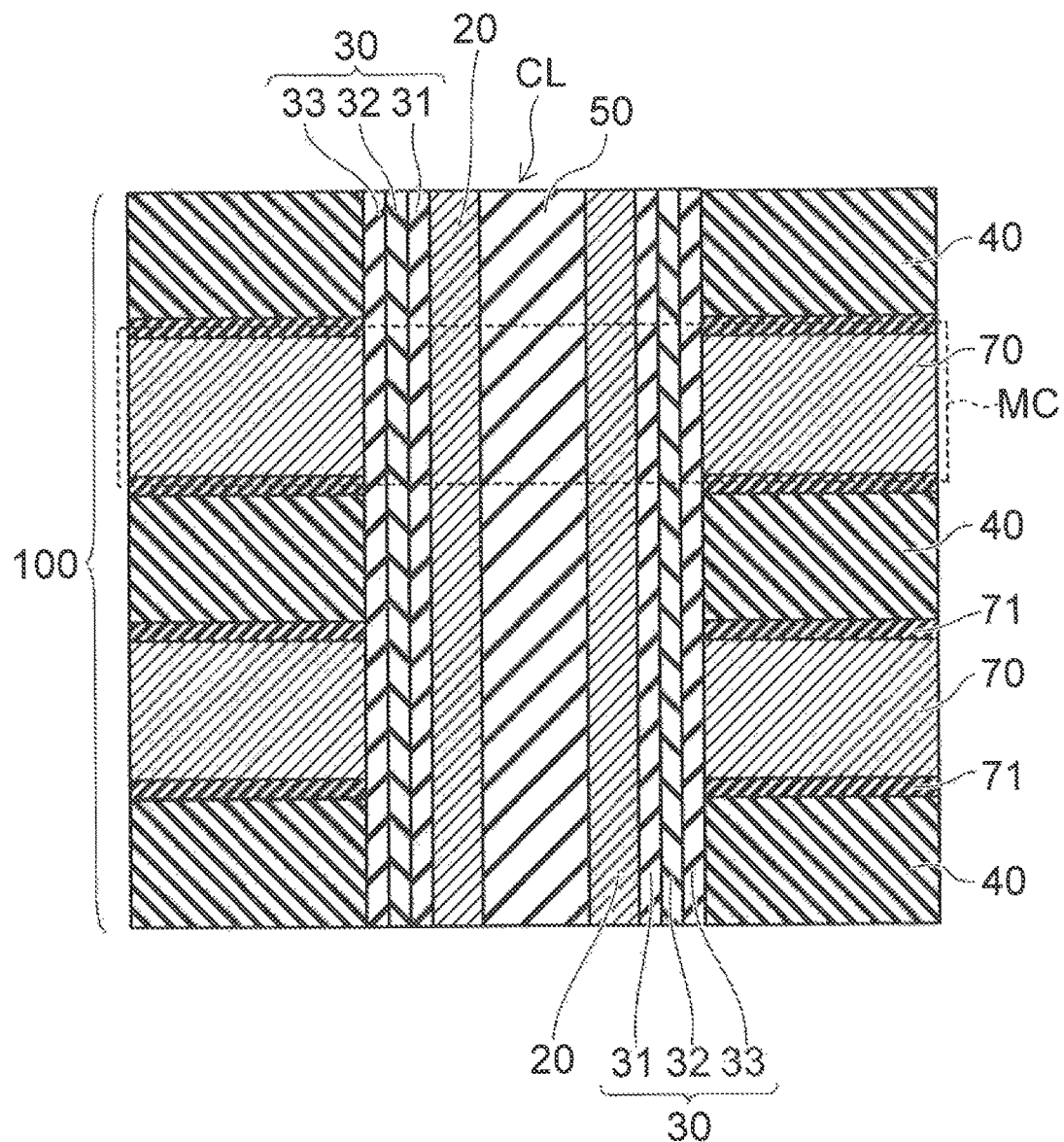
FIG. 3 is an enlarged cross-sectional view of a portion of FIG. 2.

FIG. 3 is an enlarged cross-sectional view of a portion of FIG. 2.

The memory film 30 is a stacked film including a blocking insulating film 33, a charge storage film 32, and a tunneling insulating film 31. The blocking insulating film 33, the charge storage film 32, the tunneling insulating film 31, and the semiconductor film 20 extend to be continuous in the stacking direction of the stacked body 100. The blocking insulating film 33, the charge storage film 32, and the tunneling insulating film 31 are provided in order from the stacked body 100 side between the stacked body 100 and the semiconductor film 20.

The blocking insulating film 33 contacts the metal films 70; the tunneling insulating film 31 contacts the semiconductor film 20; and the charge storage film 32 is provided between the blocking insulating film 33 and the tunneling insulating film 31.

The semiconductor film 20, the memory film 30, and the metal film 70 are included in a memory cell MC. The memory cell MC has a vertical transistor structure in which the metal film 70 is provided around the periphery of the semiconductor film 20 with the memory film 30 interposed.

The semiconductor film 20 functions as a channel of the memory cell MC; and the metal film 70 functions as a control gate (a control electrode). The charge storage film 32 functions as a data storage layer that stores charge injected from the semiconductor film 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 is an insulative film having many trap sites that trap the charge and includes, for example, a silicon nitride film.

The tunneling insulating film 31 is used as a potential barrier when the charge is injected from the semiconductor film 20 into the charge storage film 32 or when the charge stored in the charge storage film 32 releases into the semiconductor film 20. The tunneling insulating film 31 includes, for example, a silicon oxide film.

The blocking insulating film 33 prevents the charge stored in the charge storage film 32 from releasing into the metal films 70. Also, the blocking insulating film 33 suppresses back-tunneling of electrons from the metal films 70 in the erasing operation.

The blocking insulating film 33 includes, for example, a silicon oxide film, a film having a higher dielectric constant than a silicon oxide film, or a stacked film of such a film and a silicon oxide film. The film having the dielectric constant higher than that of the silicon oxide film is, for example, a silicon nitride film, an aluminum oxide film, a hafnium oxide film, or an yttrium oxide film.

As shown in FIG. 1, a drain-side select transistor STD is provided at the upper end portion of the columnar unit CL; and a source-side select transistor STS is provided at the lower end portion of the columnar unit CL. Among the metal films 70, at least the metal film 70 of the lowermost layer functions as a control gate (a control electrode) of the source-side select transistor STS. Among the metal films 70, at least the metal film 70 of the uppermost layer functions as a control gate (a control electrode) of the drain-side select transistor STD. Similarly to the memory cell MC, the drain-side select transistor STD and the source-side select transistor STS are vertical transistors in which currents flow in the stacking direction of the stacked body 100 (the Z-direction).

The memory cells MC are provided between the drain-side select transistor STD and the source-side select transistor STS. The memory cells MC, the drain-side select transistor STD, and the source-side select transistor STS are connected in series via the semiconductor film 20 and are included in one memory string. For example, the memory strings have a staggered arrangement in a surface direction parallel to the X-Y plane; and the memory cells MC are provided three-dimensionally in the X-direction, the Y-direction, and the Z-direction.

As shown in FIG. 2, insulating films 62 are provided at the two side surfaces in the Y-direction of the conductive member LI dividing the stacked body 100 in the Y-direction. The insulating films 62 are provided between the stacked body 100 and the conductive member LI. The insulating films 62 are not shown in FIG. 1.

The conductive member LI is, for example, a metal material containing tungsten as a major component. The upper end portion of the conductive member LI is connected to the source layer SL provided on the stacked body 100 and shown in FIG. 1. As shown in FIG. 2, the lower end of the conductive member LI contacts the substrate 10. Also, the lower end of the semiconductor film 20 contacts the substrate 10. The substrate 10 is, for example, a silicon substrate that is doped with an impurity and is conductive. Accordingly, the lower end of the semiconductor film 20 is electrically connectable to the source layer SL via the substrate 10 and the conductive member LI.

According to the embodiment, the intermediate film 71 containing silicon nitride as a major component is provided between the metal film 70 functioning as the electrode and the silicon oxide film 40 insulating between the electrodes. The intermediate film 71 increases the adhesion between the metal film 70 and the silicon oxide film 40.

Also, the intermediate films 71 function as barrier layers. There are cases where the oxygen inside the silicon oxide films 40 desorbs due to the heat treatment of the processes after the stacked body 100 is formed. The intermediate films 71 block the oxygen from diffusing into the metal films 70. Therefore, the increased resistance due to the oxidization of the metal films 70 can be suppressed.

Also, the intermediate films 71 block the metal (the tungsten or the molybdenum) inside the metal films 70 from diffusing into the silicon oxide films 40. The prevention of the metal contamination of the silicon oxide films 40 prevents characteristic fluctuation such as insulative property degradation of the silicon oxide films 40, etc.

Also, according to the embodiment, the nitrogen composition ratio of the intermediate film 71 is higher on the side of the interface between the intermediate film 71 and the metal film 70 than on the side of the interface between the intermediate film 71 and the silicon oxide film 40. The silicon composition ratio of the intermediate film 71 is higher on the side of the interface between the intermediate film 71 and the silicon oxide film 40 than on the side of the interface between the intermediate film 71 and the metal film 70. Here, the composition ratio refers to the atomic percent.

For example, in the case where the metal films 70 are formed by chemical vapor deposition (CVD), impurity elements (elements other than tungsten or molybdenum) inside the source gas and/or the reducing gas may be included in the metal films 70. In the case where the impurity elements diffuse into the silicon oxide films 40 in a subsequent heat treatment process, leaks between the metal films 70 may occur. The intermediate films 71 suppress the diffusion into the silicon oxide films 40 of the impurity elements included in the metal films 70.

For example, in the case where the metal films 70 are formed by CVD using a gas including $SiH_4$ and $B_2H_6$ as the reducing gas, Si and B are included inside the metal films 70. According to the embodiment, because the nitrogen composition ratio of the intermediate film 71 is higher on the side of the interface between the intermediate film 71 and the metal film 70 than on the side of the interface between the intermediate film 71 and the silicon oxide film 40, nitriding of the impurity elements (Si and B) is promoted easily; and it is possible to fix the impurity elements at the vicinity of the interface between the metal film 70 and the intermediate film 71.

The intermediate films 71 containing silicon nitride as a major component are included with the silicon oxide films 40 in insulating films (inter-electrode insulating films) between the metal films 70. Silicon nitride has a higher dielectric constant than silicon oxide. Thickly distributing silicon nitride which has a high dielectric constant inside the inter-electrode insulating films for which thinner films are necessary may cause an RC delay.

According to the embodiment, the nitrogen composition ratio of the intermediate film 71 is lower on the side of the interface between the intermediate film 71 and the silicon oxide film 40 than on the side of the interface between the intermediate film 71 and the metal film 70. Therefore, in the intermediate film 71, the distribution of the SiN or the SiON which has a high dielectric constant is substantially limited to only the side of the interface between the intermediate film 71 and the metal film 70; and the effective film thickness of the SiN film or the SiON film in the inter-electrode insulating film can be suppressed. This suppresses the RC delay.

A method for manufacturing the semiconductor memory device of the embodiment will now be described with reference to FIG. 4 to FIG. 6.

Figure 4:
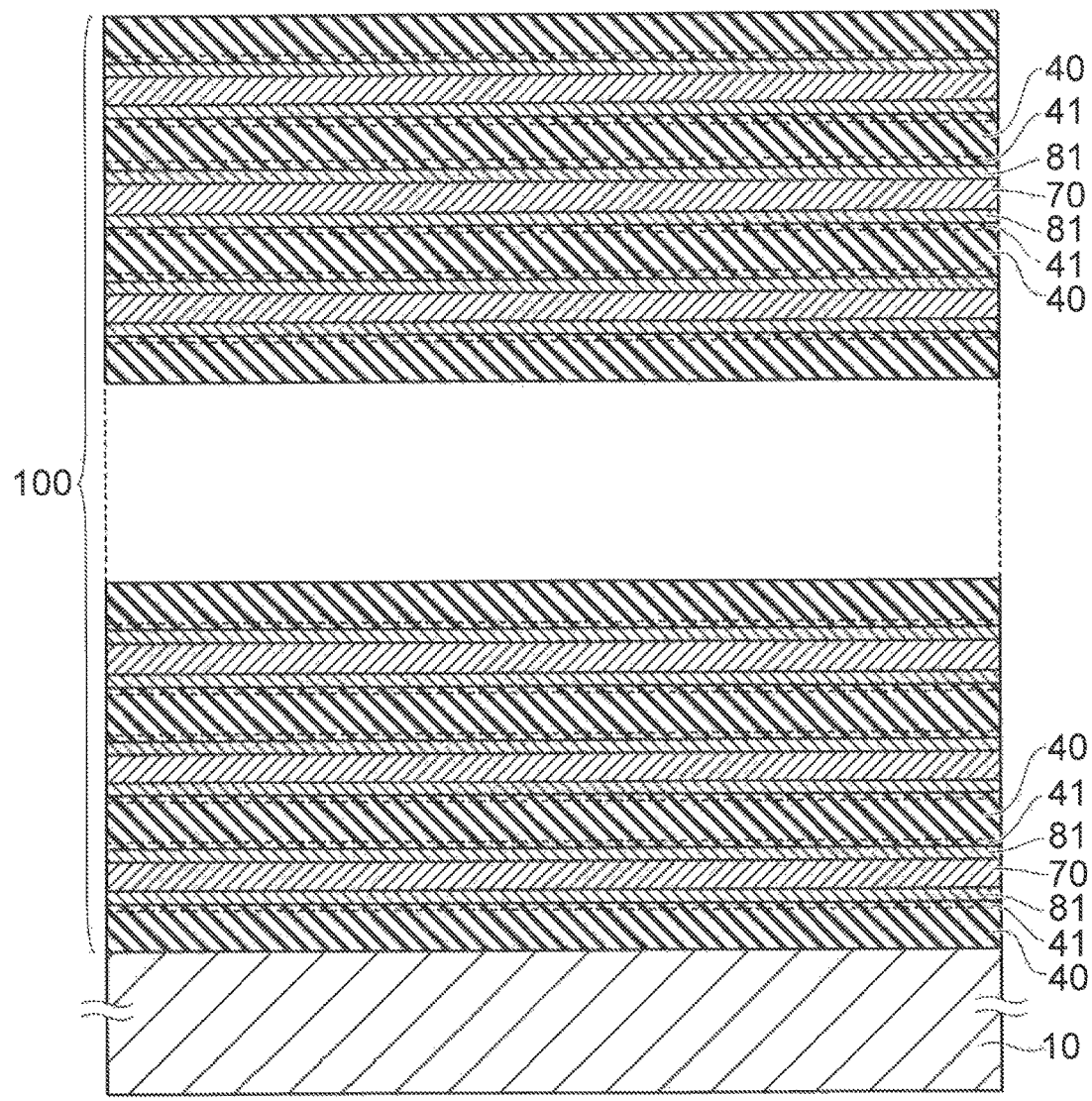
FIGS. 4 to 11 are schematic cross-sectional views showing a method for manufacturing the semiconductor device of the embodiment.
Figure 5:
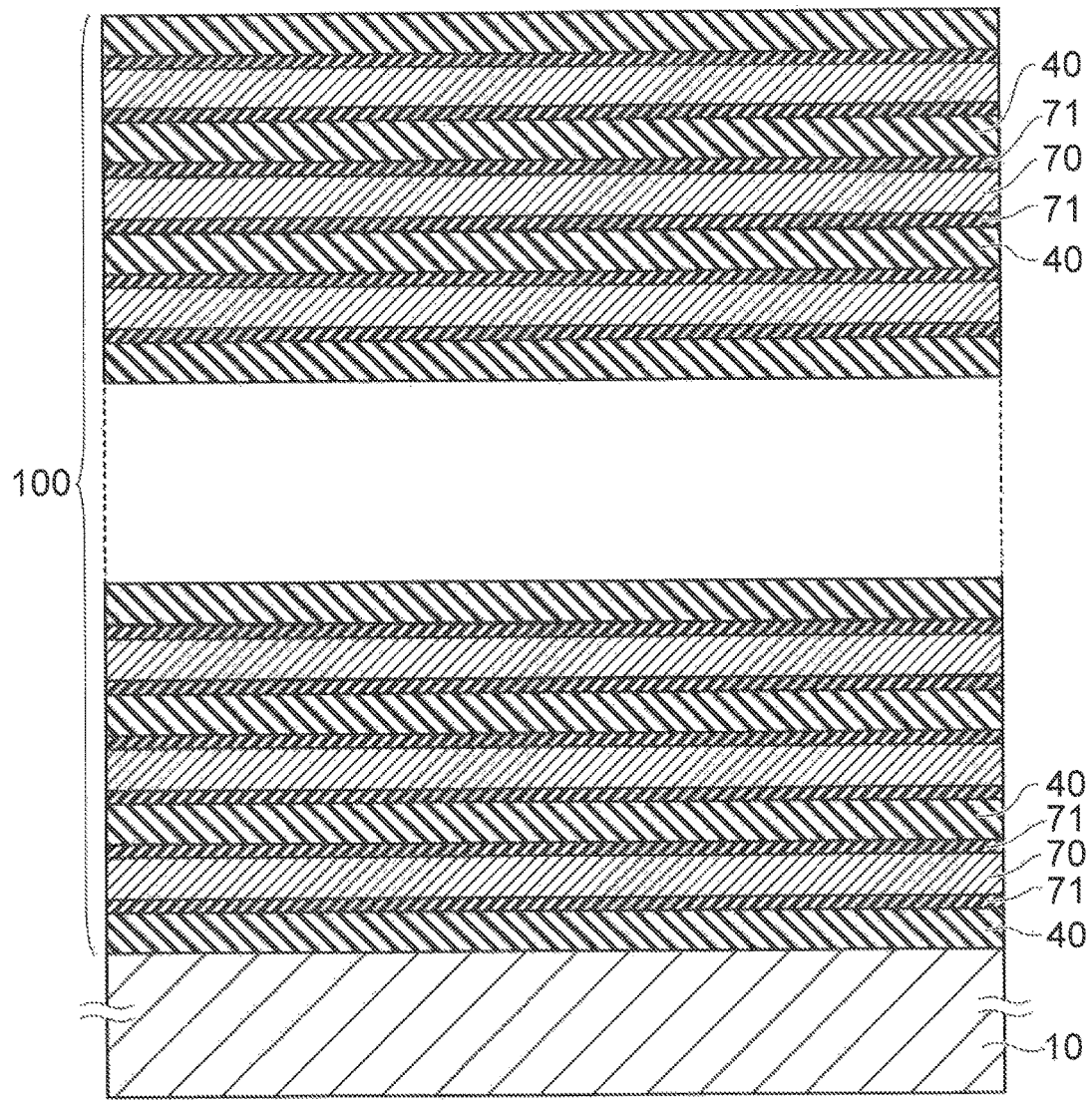

As shown in FIG. 4, the stacked body 100 is formed on the substrate 10. A silicon oxide film (a first silicon oxide film) 40 is formed on the major surface of the substrate 10. Continuing, a silicon oxide film (a second silicon oxide film) 41 is formed on the surface of the silicon oxide film 40.

For example, the silicon oxide film 40 and the silicon oxide film 41 can be formed by plasma CVD using at least one of TEOS (tetraethyl orthosilicate), $SiH_4$, and $Si_2H_6$ as a source gas containing silicon, and at least one of $O_2$, $N_2O$, CO, and $CO_2$ as an oxidative source gas. The silicon oxide film 40 and the silicon oxide film 41 are formed continuously inside the same CVD chamber.

The silicon composition ratio of the silicon oxide film 41 is higher than the silicon composition ratio of the silicon oxide film 40. The silicon oxide film 41 is a silicon-rich film in which the silicon composition ratio is higher than that of $SiO_2$.

For example, the silicon composition ratios of the silicon oxide film 40 and the silicon oxide film 41 can be controlled by setting the flow rate ratio of the oxidative source gas and the source gas containing silicon to increase the proportion of the source gas containing silicon on the side of the interface with a metal nitride film 81.

The silicon oxide film 41 is thinner than the silicon oxide film 40. For example, the thickness of the silicon oxide film 40 is 5 to 50 nm; and the thickness of the silicon oxide film 41 is 1 to 2 nm.

Then, the metal nitride film 81 is formed on the silicon oxide film 41; the metal film 70 is formed on the metal nitride film 81; and the metal nitride film 81 again is formed on the metal film 70. The metal nitride films 81 are formed on the upper surface and lower surface of the metal film 70.

The metal nitride films 81 and the metal film 70 are formed continuously inside the same chamber by sputtering. The metal nitride films 81 and the metal film 70 are formed using the same target. For example, tungsten nitride films are formed as the metal nitride films 81 by introducing argon (Ar) gas and nitrogen ($N_2$) gas to the sputtering chamber and by performing sputtering of a tungsten target.

Then, the introduction of the nitrogen gas into the chamber is stopped; the nitrogen gas is exhausted from the chamber; and sputtering of the same tungsten target is performed using only argon gas. Thereby, a tungsten film is formed as the metal film 70 on the metal nitride film (the tungsten nitride film) 81.

After the metal film 70 is formed, a tungsten nitride film is formed as the metal nitride film 81 on the metal film (the tungsten film) 70 by again introducing nitrogen gas to the chamber and by performing sputtering of the tungsten target.

Or, molybdenum nitride films may be formed as the metal nitride films 81 by performing sputtering of a molybdenum target inside the chamber including nitrogen gas; and a molybdenum film may be formed as the metal film 70 by performing sputtering of the molybdenum target using only argon gas.

The metal film 70 is thicker than the metal nitride films 81. For example, the thickness of the metal film 70 is 5 to 50 nm; and the thicknesses of the metal nitride films 81 are 0.1 to 5 nm.

Then, the wafer again is moved into the CVD chamber; and the silicon oxide films 41 and the silicon oxide film 40 are formed on the metal nitride film 81. At this time as well, the silicon oxide films 41 and the silicon oxide film 40 are formed continuously inside the same chamber by plasma CVD.

The silicon oxide films 41 having a silicon composition ratio higher than that of the silicon oxide film 40 are formed on the upper surface and lower surface of the silicon oxide film 40. The silicon oxide films 41 are thinner than the silicon oxide film 40.

When forming the silicon oxide films 40 and 41, it is unnecessary for the combinations of the oxidative source gas and the source gas containing silicon to be the same combination. For example, TEOS may be used as the source gas containing silicon for the silicon oxide film 40. $SiH_4$ may be used as the source gas containing silicon for the silicon oxide film 41. The silicon composition ratios of the TEOS and the SiH$_4$ may be controlled.

Even in the case where the same combination of source gases is used, the silicon oxide films 40 and 41 can be formed to have mutually-different silicon composition ratios by controlling the film formation conditions such as the gas flow rate, the high frequency electrical power amount, etc.

Then, the wafer again is moved into the sputtering chamber; and the metal nitride film 81, the metal film 70, and the metal nitride film 81 are formed as described above on the silicon oxide film 41.

Thereafter, the processes of forming the silicon oxide film 41, the silicon oxide film 40, the silicon oxide film 41, the metal nitride film 81, the metal film 70, and the metal nitride film 81 are multiply repeated similarly.

Thus, the stacked body 100 in which the metal films 70 and the silicon oxide films 40 are repeated at a prescribed period is formed on the substrate 10. The metal nitride film 81 and the silicon-rich silicon oxide film 41 are interposed between the metal film 70 and the silicon oxide film 40. The stacked film of the metal nitride film 81 and the silicon oxide film 41 is provided at the interface between the metal film 70 and the silicon oxide film 40. The stacked film is thin compared to the metal film 70 and the silicon oxide film 40.

When forming the silicon oxide films 40 and 41, the surface of the metal film 70 is covered with the metal nitride film 81 and is not exposed to the gas containing oxygen. Accordingly, the surface of the metal film 70 is not oxidized; and the increased resistance due to such oxidization is prevented. The metal nitride film 81 is more difficult to oxidize than the metal film 70.

Then, for example, heat treatment of the stacked body 100 (the wafer) is performed at a temperature of 200 to 1100° C. By the heat treatment, the silicon of the silicon oxide film 41 and the nitrogen of the metal nitride film 81 react to form the intermediate film 71 that contains silicon nitride as a major component between the silicon oxide film 40 and the metal film 70 as shown in FIG. 5. The intermediate film 71 is a silicon nitride film or a silicon oxynitride film. The composition ratio of silicon and nitrogen inside the intermediate film 71 is nonuniform in the film thickness direction as described above.

Silicon that can produce silicon nitride by reacting with nitrogen is contained more excessively in the silicon oxide films 41 contacting the metal nitride films 81 than in the silicon oxide films 40. After the heat treatment, similarly to the silicon oxide films 40, the composition of the silicon oxide films 41 is SiO$_2$ or a composition near SiO$_2$. The silicon oxide films 41 after the heat treatment are shown as layers that are one body with the silicon oxide film 40.

By the heat treatment, the crystallization of the metal (e.g., the tungsten) of the metal nitride film 81 on the side of the interface with the metal film 70 proceeds; and desorption of the nitrogen from the metal nitride film 81 is promoted. A crystal layer of the meta (e.g., the tungsten) of the metal nitride film 81 is formed at the interface between the metal film 70 and the metal nitride film 81; and the effective film thickness of the metal film (e.g., the tungsten film) 70 becomes greater than before the heat treatment recited above. This causes a resistance reduction of the metal film 70, i.e., the electrode. It is tolerable that a small amount of nitrogen that could not be desorbed completely to the intermediate film 71 side remains in the metal film 70 on the side of the interface with the intermediate film 71.

The nitrogen composition ratio of the intermediate film 71 formed by the reaction in the heat treatment recited above is higher on the side of the interface between the intermediate film 71 and the metal film 70 than on the side of the interface between the intermediate film 71 and the silicon oxide film 40; and the silicon composition ratio of the intermediate film 71 is higher on the side of the interface between the intermediate film 71 and the silicon oxide film 40 than on the side of the interface between the intermediate film 71 and the metal film 70.

Compared to silicon nitride films that are formed in a film formation process such as CVD, sputtering, etc., the intermediate film 71 that is formed by the reaction of the elements contained in the adjacent films has good adhesion with the silicon oxide film 40 and the metal film 70. Because the adhesion of each film of the stacked body 100 can be ensured, the subsequent processes such as the etching to make memory holes MH, the film formation of the columnar units CL, etc., can proceed appropriately even in the case where the number of stacks is high (the stacked body 100 is thick).

Figure 6:
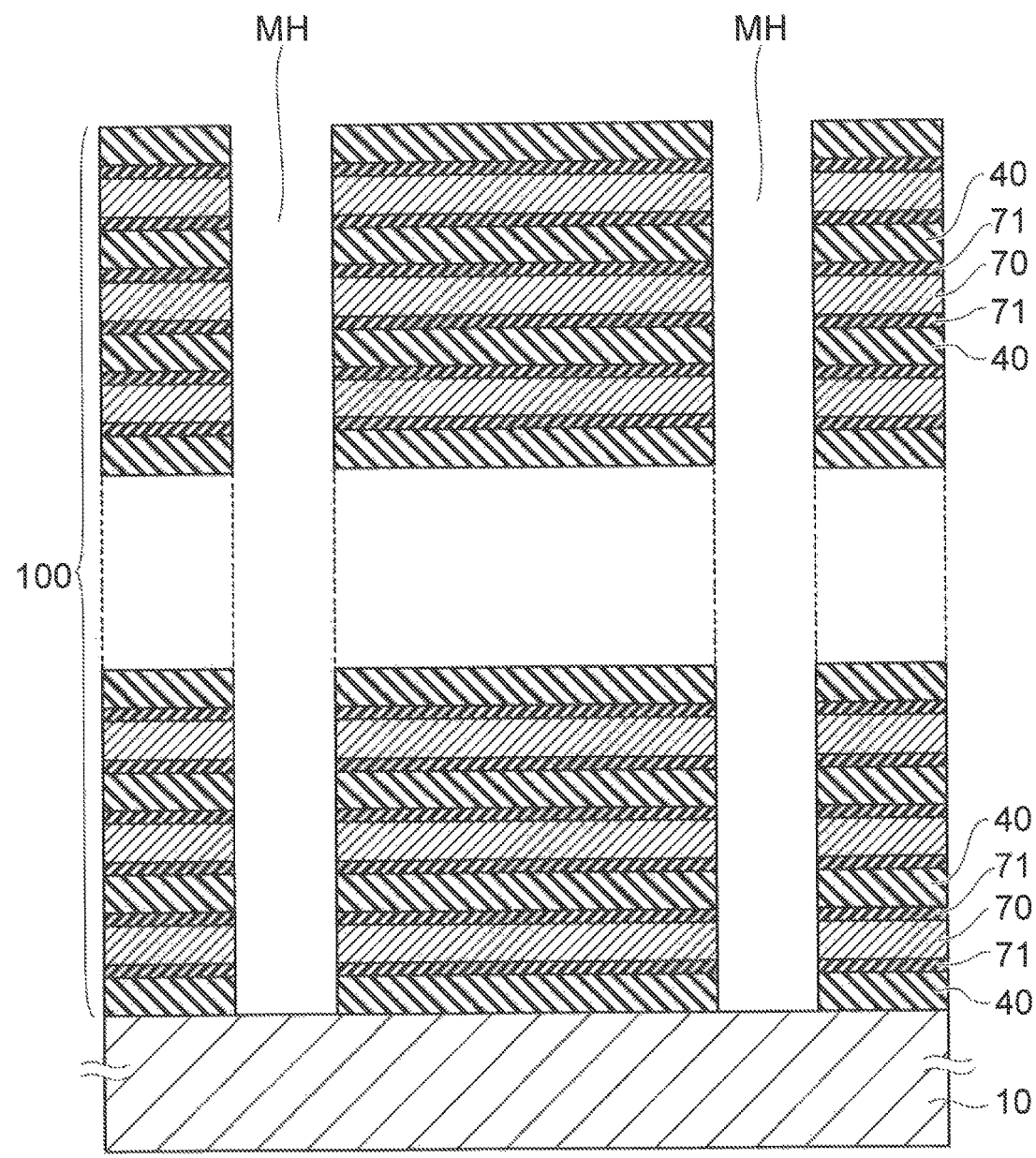

After the heat treatment recited above, the memory holes MH are made in the stacked body 100 as shown in FIG. 6. The memory holes MH are made by reactive ion etching (RIE) using a not-shown mask layer formed on the stacked body 100. The memory holes MH pierce the stacked body 100 and reach the substrate 10.

Each film that is included in the columnar unit CL shown in FIG. 2 is formed inside the memory hole MH. First, the memory film 30 is formed conformally on the side surface and bottom of the memory hole MH. The memory film 30 on the bottom of the memory hole MH is removed by, for example, RIE; and the substrate 10 is exposed at the bottom of the memory hole MH. Subsequently, the semiconductor film 20 is formed on the inner side of the memory film 30 inside the memory hole MN. The lower end of the semiconductor film 20 contacts the substrate 10 at the bottom of the memory hole MH. After the semiconductor film 20 is formed, the core insulating film 50 is formed on the inner side of the semiconductor film 20.

A slit is made in the stacked body 100 in the portion where the conductive member LI is to be provided. The slit extends in the stacking direction (the Z-direction) and into the page surface (the X-direction) of FIG. 2, and divides the stacked body 100 in the Y-direction.

The conductive member LI is formed, with the insulating films 62 interposed, inside the slit. The insulating films 62 are formed conformally on the side surface and bottom of the slit. The insulating film 62 on the bottom of the slit is removed by, for example, RIE; and the substrate 10 is exposed at the bottom of the slit. Subsequently, the conductive member LI is formed on the inner sides of the insulating films 62 inside the slit; and the lower end of the conductive member LI contacts the substrate 10.

After the stacked body 100, the columnar units CL, and the conductive members LI are formed, the upper layer interconnects such as the bit lines BL, the source layers SL, etc., shown in FIG. 1 are formed on the stacked body 100.

The stacked body 100 and the method for manufacturing the stacked body 100 of another embodiment will now be described with reference to FIG. 7A to FIG. 11.

FIG. 7A to FIG. 11 show enlarged cross sections of a portion of the stacked body 100 formed on a substrate (not shown).

Figure 7A:
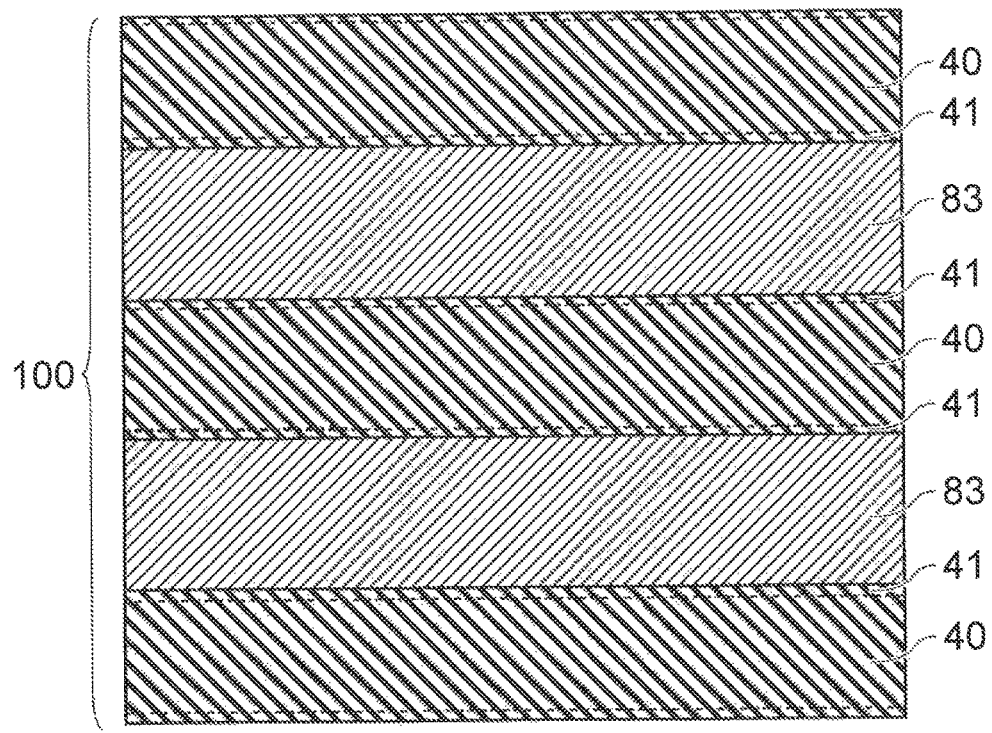

As shown in FIG. 7A, similarly to the embodiment described above, the silicon oxide film (the first silicon oxide film) 40 and the silicon oxide film (the second silicon oxide film) 41 having a higher silicon composition ratio than the silicon oxide film (the first silicon oxide film) 40 are formed by plasma CVD. Subsequently, the wafer is moved from the CVD chamber into a sputtering chamber; and a metal nitride film 83 is formed on the silicon oxide film 41.

For example, a tungsten nitride film or a molybdenum nitride film is formed as the metal nitride film 83 by introducing argon gas and nitrogen gas to the sputtering chamber and by performing sputtering of a tungsten or molybdenum target.

The metal nitride film 83 is thicker than the silicon oxide film 41. For example, the thickness of the metal nitride film 83 is 10 to 50 nm.

Then, the wafer again is moved into the CVD chamber; and the silicon oxide films 41 and the silicon oxide film 40 are formed on the metal nitride film 83. First, the silicon oxide film 41 is formed on the surface of the metal nitride film 83; and subsequently, the silicon oxide film 40 is formed on the silicon oxide film 41. Further, continuing, the silicon oxide film 41 is formed on the surface of the silicon oxide film 40.

Then, the wafer again is moved into the sputtering chamber; and the metal nitride film 83 is formed on the silicon oxide film 41 as described above.

Thereafter, the processes of forming the silicon oxide film 41, the silicon oxide film 40, the silicon oxide film 41, and the metal nitride film 83 are multiply repeated similarly.

Thus, the stacked body 100 in which the multiple silicon oxide films 40 and the multiple metal nitride films 83 are repeated at a prescribed period is formed on the substrate. The silicon-rich silicon oxide film 41 is interposed between the metal nitride film 83 and the silicon oxide film 40.

Although the surface of the metal nitride film 83 is exposed to the gas containing oxygen when forming the silicon oxide films 40 and 41, the metal nitride film 83 is more difficult to oxidize than a metal film.

Figure 7B:
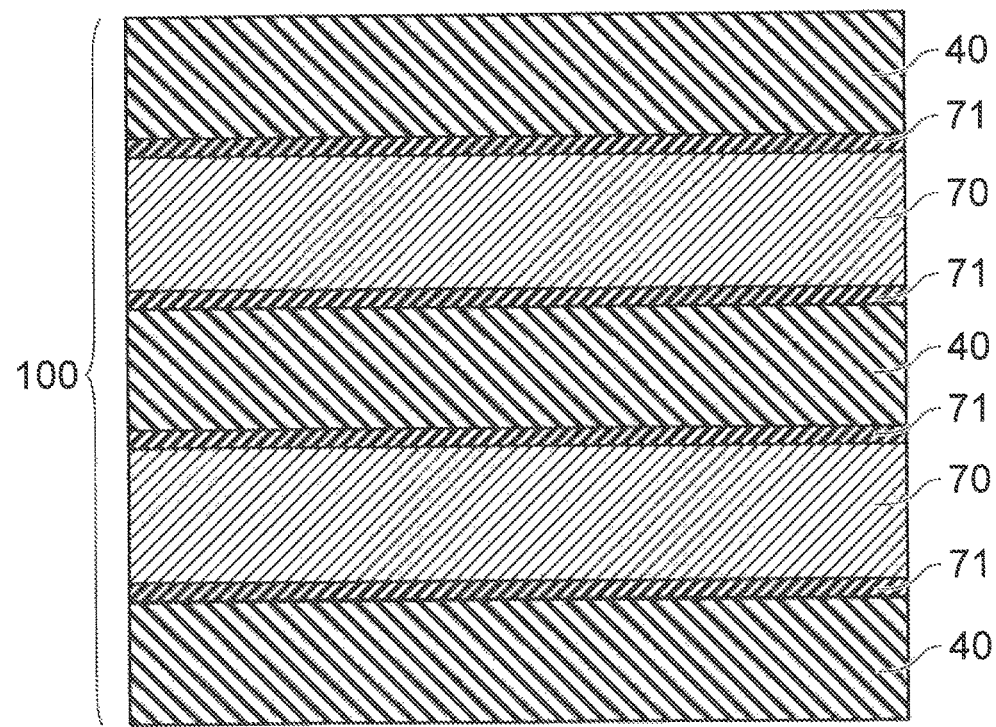

Then, for example, heat treatment of the stacked body 100 (the wafer) is performed at a temperature of 200 to 1100° C. By the heat treatment, the intermediate films 71 are formed as shown in FIG. 7B by the silicon of the silicon oxide films 41 and the nitrogen of the metal nitride films 83 reacting.

Silicon that can form silicon nitride by reacting with nitrogen is contained more excessively in the silicon oxide films 41 contacting the metal nitride films 83 than in the silicon oxide films 40. After the heat treatment, similarly to the silicon oxide films 40, the composition of the silicon oxide films 41 is $SiO_2$ or a composition near $SiO_2$. The silicon oxide films 41 after the heat treatment are shown as layers that are one body with the silicon oxide film 40.

Further, in the heat treatment, the crystallization of the metal (e.g., the tungsten) of the metal nitride films 83 proceeds; and the desorption of nitrogen from the metal nitride films 83 is promoted. The nitrogen diffuses to the silicon oxide film 41 side, reacts with the silicon of the silicon oxide films 41, and forms the intermediate films 71. By the desorption of the nitrogen from the metal nitride films 83, the greater parts of the metal nitride films 83 are modified into the metal films (e.g., the tungsten films) 70 as shown in FIG. 7B. It is tolerable for a small amount of nitrogen that could not be desorbed completely to the intermediate film 71 side to remain inside the metal film 70.

The stacked body 100 having a structure in which the multiple metal films 70 and the multiple silicon oxide films 40 are stacked at a prescribed period and the intermediate film 71 is provided between the metal film 70 and the silicon oxide film 40 is obtained. The metal films 70 having a lower resistivity than the metal nitride films 83 can be used as the electrodes. As described above, the intermediate films 71 function as adhesion layers and/or barrier layers.

Subsequently, similarly to the embodiment recited above, the processes of making the memory holes MH, forming the films included in the columnar units CL, forming the conductive members LI, etc., proceed.

In the method shown in FIG. 7A and FIG. 7B as well, the intermediate films 71 are formed by reactions between the elements contained in adjacent films. The nitrogen composition ratio of such an intermediate film 71 is higher on the side of the interface between the intermediate film 71 and the metal film 70 than on the side of the interface between the intermediate film 71 and the silicon oxide film 40; and the silicon composition ratio of the intermediate film 71 is higher on the side of the interface between the intermediate film 71 and the silicon oxide film 40 than on the side of the interface between the intermediate film 71 and the metal film 70.

Compared to silicon nitride films formed by a film formation process such as CVD, sputtering, etc., the intermediate film 71 formed by such a heat treatment reaction has good adhesion with the silicon oxide film 40 and the metal film 70. Because the adhesion of each film of the stacked body 100 can be ensured, the subsequent processes such as the etching to make the memory holes MH, the film formation of the columnar units CL, etc., can proceed appropriately even in the case where the number of stacks is high (the stacked body 100 is thick).

Also, the nitrogen composition ratio of the intermediate film 71 is lower on the side of the interface between the intermediate film 71 and the silicon oxide film 40 than on the side of the interface between the intermediate film 71 and the metal film 70. Therefore, the distribution of SiN or SiON in the intermediate film 71 can be limited to only the side of the interface with the metal film 70; and the effective film thickness of the SiN film or the SiON film inside the inter-electrode insulating film can be suppressed. This suppresses the RC delay.

The memory holes MH may be made in the stacked body 100 after forming the stacked body 100 including the silicon oxide films 40 and 41 and the metal nitride films 83 and prior to forming the metal films 70 and the intermediate films 71 by the heat treatment.

Figure 8A:
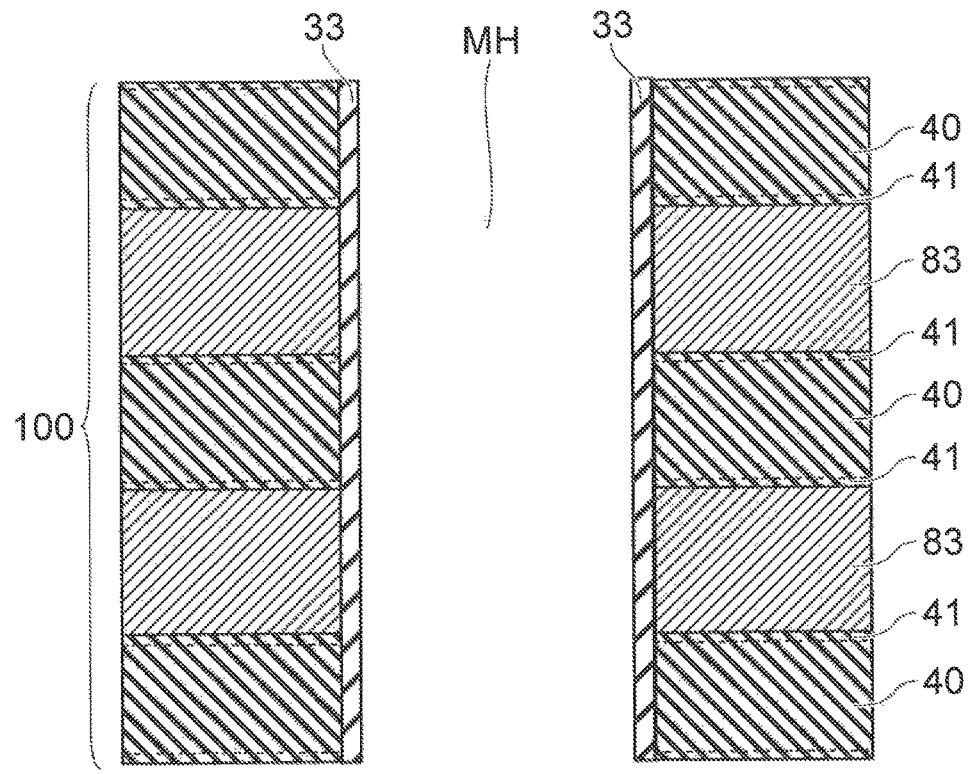

After making the memory hole MH, the blocking insulating film 33 is formed on the side surface of the memory hole MH as shown in FIG. 8A. A silicon oxide film, a metal oxide film, or a stacked film of a silicon oxide film and a metal oxide film is formed as the blocking insulating film 33. In the case of the stacked film, first, a metal oxide film is formed on the side surface of the memory hole MH; and a silicon oxide film is formed on the side surface of the metal oxide film. The blocking insulating film 33 of such a stacked film has superior blocking properties for the electrons removed from the charge storage film 32 toward the metal film 70 side, and for the electrons back-tunneling from the metal film 70 in the erasing operation.

After the blocking insulating film 33 is formed by, for example, atomic layer deposition (ALD), film property improvement (repair of defects and energy levels occurring in the film formation, etc.) of the blocking insulating film 33 is performed by heat treatment.

Figure 8B:
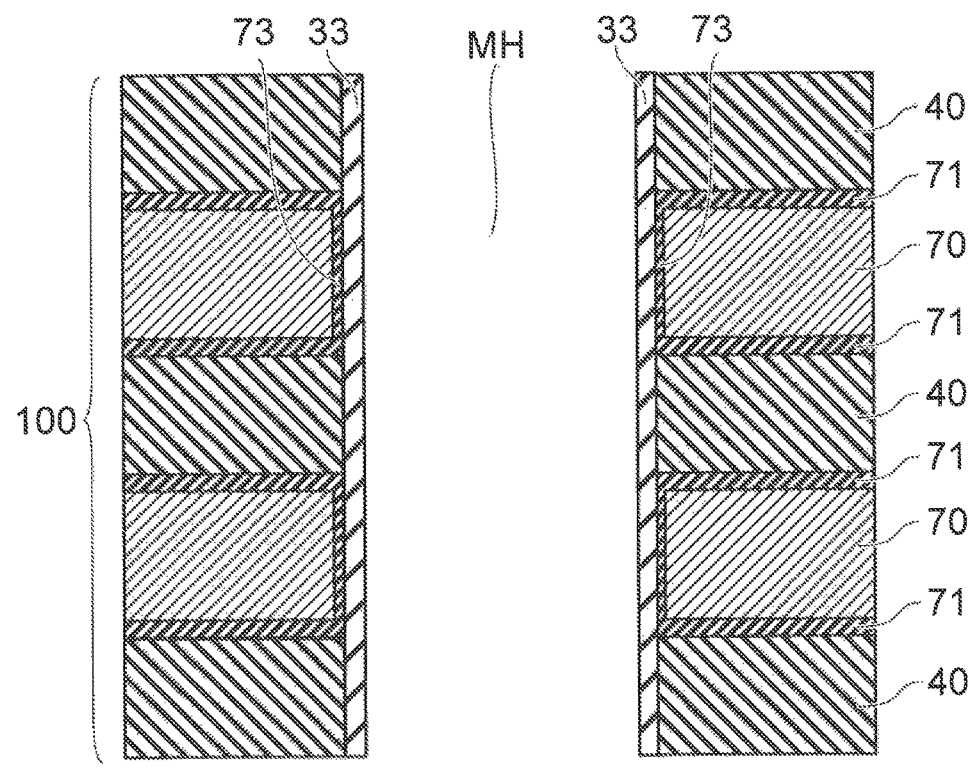

By the heat treatment at this time, the crystallization of the metal of the metal nitride films 83, the desorption of the nitrogen from the metal nitride films 83, and the reaction of the nitrogen with the silicon of the silicon oxide films 41 proceed; and the metal films 70 and the intermediate films 71 are formed as shown in FIG. 8B.

The nitrogen of the metal nitride film 83 diffuses toward the side surface of the metal nitride film 83 positioned on the memory hole MH side, and reacts with the elements contained in the blocking insulating film 33. Thereby, a nitride film 73 is formed between the blocking insulating film 33 and the side surface of the metal film 70, or at the interface between the blocking insulating film 33 and the side surface of the metal film 70.

In the case where the portion of the blocking insulating film 33 contacting the metal nitride film 83 is a silicon oxide film, the silicon of the silicon oxide film reacts with the nitrogen of the metal nitride film 83 and forms a silicon nitride film as the nitride film 73. The silicon nitride film 73 is formed continuously as one body with the intermediate films 71 between the metal film 70 and the silicon oxide films 40.

In the case where the portion of the blocking insulating film 33 contacting the metal nitride film 83 is a metal oxide film (e.g., an aluminum oxide film), the aluminum of the aluminum oxide film reacts with the nitrogen of the metal nitride film 83 and forms an aluminum nitride film as the nitride film 73.

The heat treatment recited above may be performed after forming other films included in the columnar unit CL other than the blocking insulating film 33. In such a case as well, the heat treatment can be performed also as heat treatment that improves the film properties of the other films.

The nitride film 73 provided between the metal film 70 and the blocking insulating film 33 blocks the diffusion of the metal of the metal film 70 toward the columnar unit CL side. Also, the diffusion into the metal film 70 of the oxygen contained in the memory film 30 is suppressed; and the oxidization of the metal film 70 is suppressed.

When forming the blocking insulating film 33, the metal nitride films 83 that are exposed at the side surface of the memory hole MH are more difficult to oxidize than the metal films even in the case where the side surfaces of the metal nitride films 83 are exposed to the gas including oxygen.

Figure 9A:
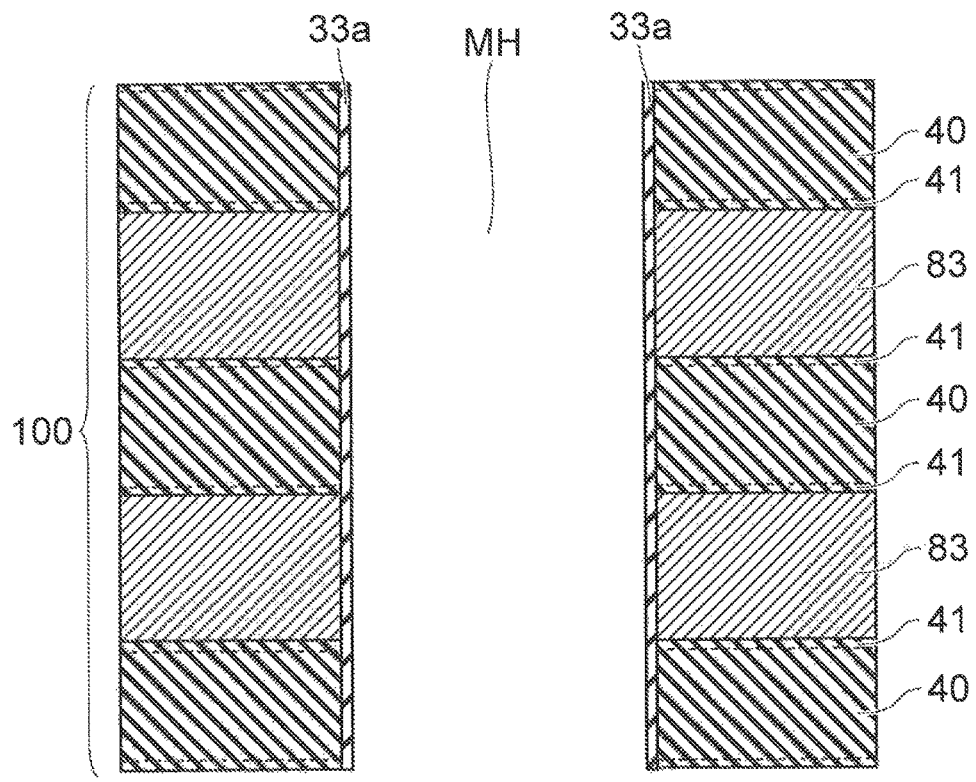

Also, a silicon nitride film 33a may be formed as the blocking insulating film 33 or a portion of the blocking insulating film 33 on the side surface of the memory hole MH as shown in FIG. 9A after making the memory hole MH and prior to the heat treatment forming the metal films 70 and the intermediate films 71. The silicon nitride film 33a is formed to have a thickness of, for example, 1 to 3 nm by CVD or ALD.

Figure 9B:
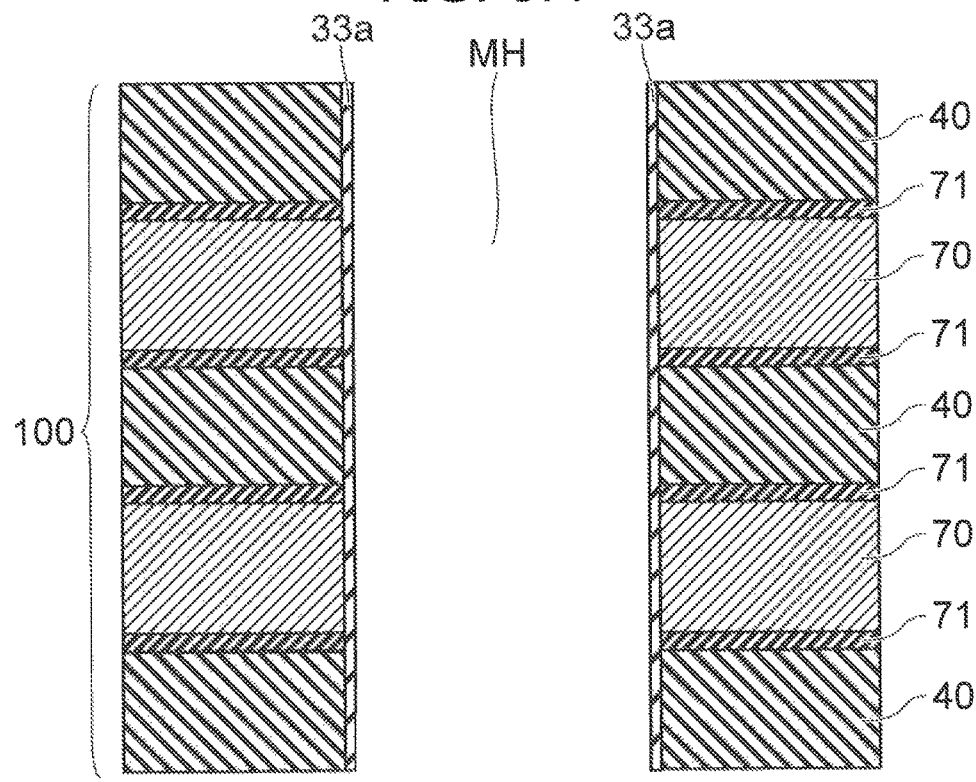

The metal films 70 and the intermediate films 71 are formed in a subsequent heat treatment as shown in FIG. 9B. In the heat treatment at this time, the nitrogen of the metal nitride films 83 diffuses also into the silicon nitride film 33a of the side surface of the memory hole MH.

Although the film properties of the silicon nitride film 33a which is a thin film of about 1 to 3 nm are likely to be insufficient as the blocking insulating film 33, the diffusion of the nitrogen from the metal nitride films 83 into the silicon nitride film 33a improves the film properties of the silicon nitride film 33a to be film properties sufficient as the blocking insulating film 33.

The heat treatment may be performed after making the memory hole MH and prior to forming the blocking insulating film 33.

Figure 10A:
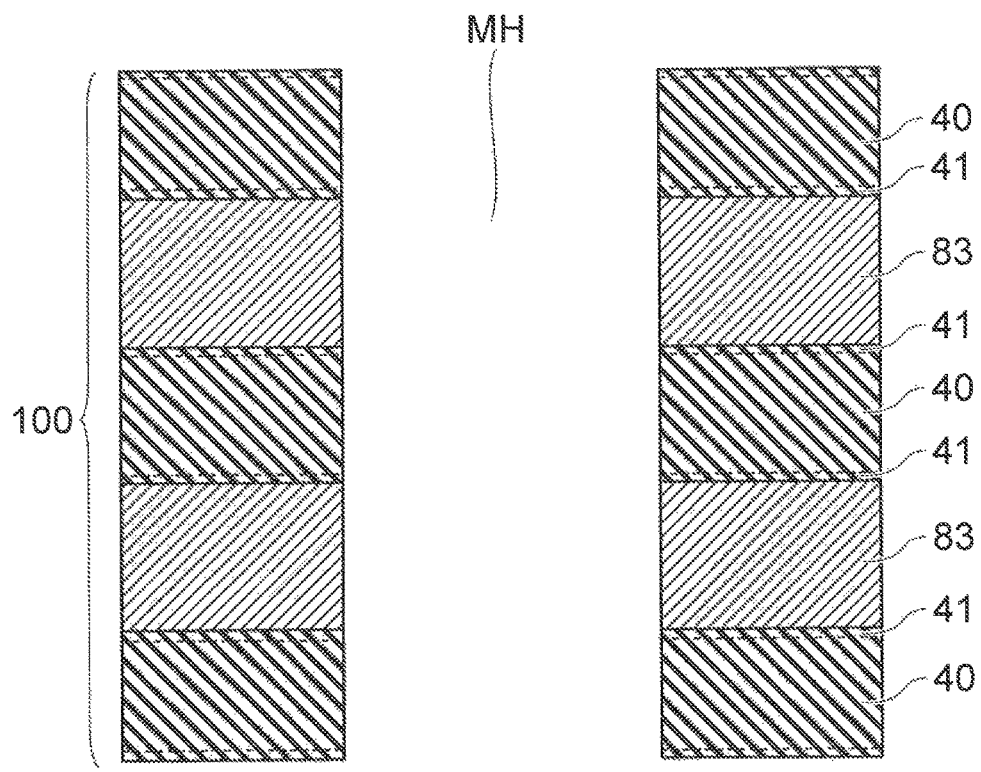

As shown in FIG. 10A, after making the memory holes MH in the stacked body 100 including the silicon oxide films 40 and 41 and the metal nitride films 83, a gas (e.g., $SiH_4$ gas) containing silicon is introduced to the chamber. The $SiH_4$ gas reaches, through the memory holes MH, the side surfaces of the metal nitride films 83 exposed at the side surfaces of the memory holes MH; and the silicon adsorbs to the side surfaces of the metal nitride films 83 by the assistance of plasma or thermal energy.

Figure 10B:
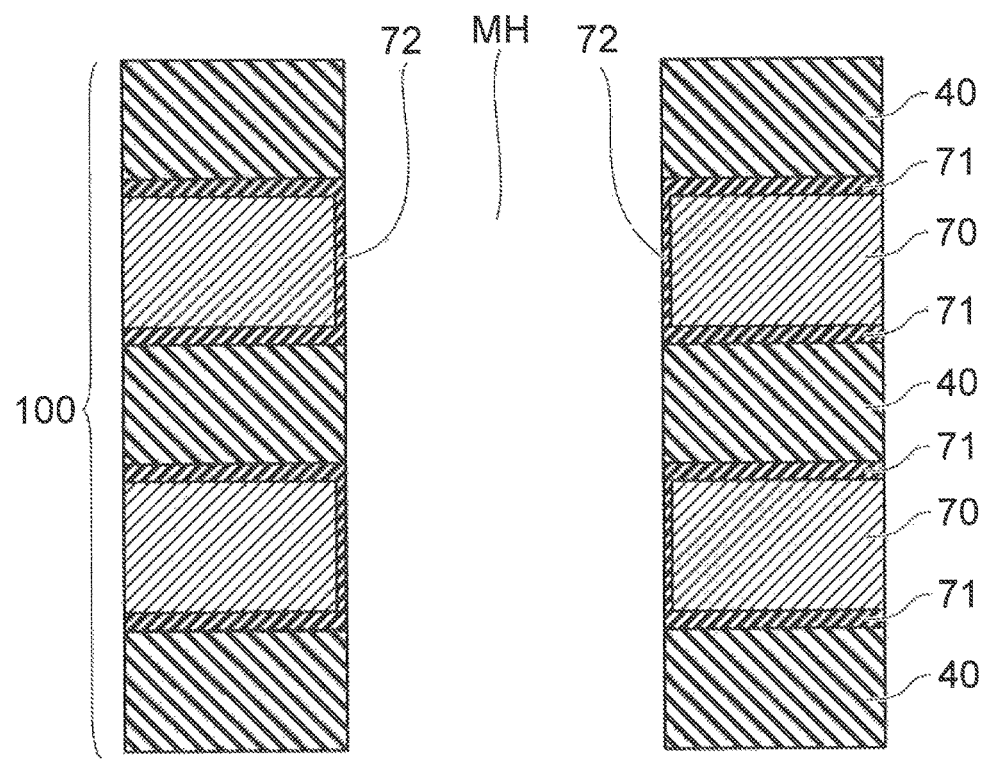

Subsequently, by heat treatment, the metal of the metal nitride films 83 is crystallized; nitrogen is desorbed from the metal nitride films 83; the nitrogen reacts with the silicon of the silicon oxide films 41; and the metal films 70 and the intermediate films 71 are formed as shown in FIG. 10B.

The nitrogen of the metal nitride films 83 diffuses also toward the side surfaces of the metal nitride films 83 positioned on the memory hole MH side, and reacts with the silicon adsorbed to the side surfaces. Thereby, silicon nitride films 72 are formed between the blocking insulating film 33 and the side surfaces of the metal films 70, or at the interfaces between the blocking insulating film 33 and the side surfaces of the metal films 70.

Figure 11:
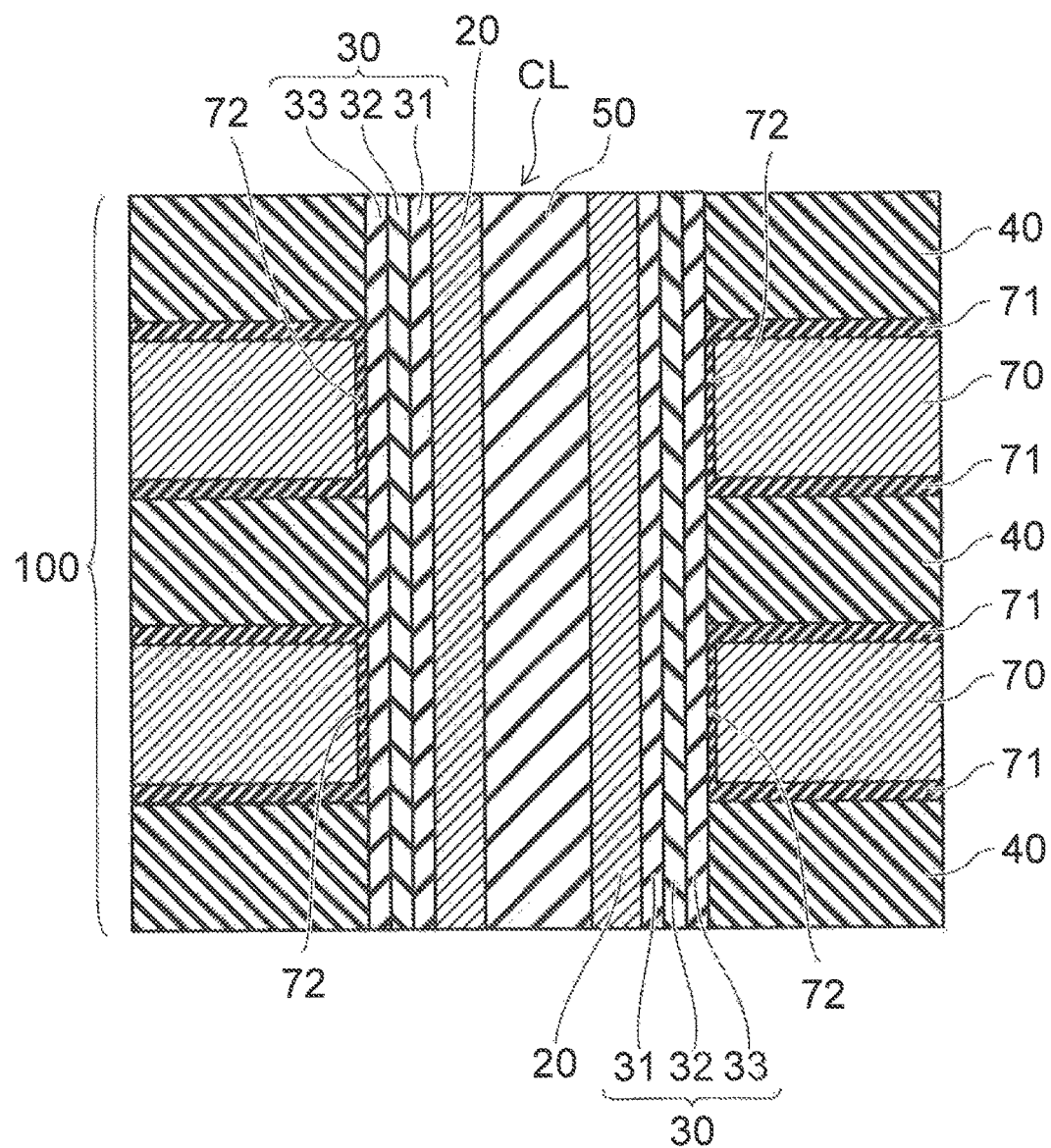

Subsequently, as shown in FIG. 11 the films included in the columnar unit CL are formed on the side surface of the memory hole MH.

The silicon nitride film 72 between the blocking insulating film 33 and the side surface of the metal film 70 is formed continuously as one body with the intermediate films 71 between the metal film 70 and the silicon oxide films 40.

The silicon nitride films 72 block the diffusion of the metal of the metal films 70 toward the columnar unit CL side. Also, the silicon nitride films 72 suppress the diffusion into the metal films 70 of the oxygen contained in the memory film 30 and suppress the oxidization of the metal films 70.

Also, the silicon nitride films 72 suppress the oxidization of the side surfaces of the metal films 70 when the blocking insulating film 33 is formed on the side surface of the memory hole MH.

The metal films 70 and the metal nitride films 71 and 83 described above are not limited to films formed by sputtering, and may be formed by thermal CVD or plasma CVD. For example, an inorganic source gas such as $WF_6$, $WCl_6$, $W(CO)_6$, etc., and various organic source gases can be used as the source gas of tungsten. For example, an inorganic source gas such as $MoF_6$, $MoCl_5$, $Mo(CO)_6$, etc., and various organic source gases can be used as the source gas of molybdenum.

The silicon oxide films 40 and 41 between the metal films 70 are not limited to films formed by plasma CVD and may be formed by thermal CVD or sputtering.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device, comprising:
a stacked body including a plurality of metal films, a plurality of silicon oxide films, and a plurality of intermediate films, the metal films containing at least one of tungsten and molybdenum, the intermediate films being provided between the metal films and the silicon oxide films, contacting the metal films and the silicon oxide films, and containing silicon nitride, each layer of the intermediate films being separated from each other in a stacking direction of the stacked body;

a pipe-like configuration film extending in the stacking direction of the stacked body in the stacked body; and a memory film provided between the pipe-like configuration film and one of the metal films, nitrogen composition ratios of the intermediate films being higher on sides of interfaces between the intermediate films and the metal films than on sides of interfaces between the intermediate films and the silicon oxide films, silicon composition ratios of the intermediate films being higher on sides of interfaces between the intermediate films and the silicon oxide films than on sides of interfaces between the intermediate films and the metal films, wherein the memory film includes
- a blocking insulating film provided between the pipe-like configuration film and one of the metal films,
- a charge storage film provided between the pipe-like configuration film and the blocking insulating film, and
- a tunneling insulating film provided between the pipe-like configuration film and the charge storage film.

2. The semiconductor device according to claim 1, wherein the memory film includes a silicon nitride film contacting the metal films.

3. The semiconductor device according to claim 1, wherein the intermediate films include a first intermediate film contacting an upper surface of one of the metal films, and a second intermediate film contacting a lower surface of the one of the metal films.

4. The semiconductor device according to claim 3, wherein the first intermediate film and the second intermediate film are not connected each other in the stacking direction.

5. The semiconductor device according to claim 1, wherein the blocking insulating film is provided between one of the intermediate films and the pipe-like configuration film.

6. A semiconductor device, comprising:

a stacked body including a plurality of metal films, a plurality of silicon oxide films, and a plurality of intermediate films, the metal films containing at least one of tungsten and molybdenum, the intermediate films being provided between the metal films and the silicon oxide films, the intermediate films including a first intermediate film directly contacting an upper metallic surface of one of the metal films and a second intermediate film directly contacting a lower metallic surface of the one of the metal films, the first intermediate film and the second intermediate film being separated from each other in a stacking direction of the stacked body, and not connected with each other in the stacking direction;

a pipe-like configuration film extending in the stacking direction of the stacked body in the stacked body; and a memory film provided between the pipe-like configuration film and one of the metal films, nitrogen composition ratios of the intermediate films being higher on sides of interfaces between the intermediate films and the metal films than on sides of interfaces between the intermediate films and the silicon oxide films, silicon composition ratios of the intermediate films being higher on sides of interfaces between the intermediate films and the silicon oxide films than on sides of interfaces between the intermediate films and the metal films.

* * * * *